(12) United States Patent
Kim et al.

(10) Patent No.: US 11,586,378 B2
(45) Date of Patent: Feb. 21, 2023

(54) DEVICES FOR GENERATING MODE COMMANDS

(71) Applicant: SK hynix Inc., Icheon-si (KR)

(72) Inventors: Chang Hyun Kim, Icheon-si (KR);
Hyun Woong Yang, Icheon-si (KR);
Soo Bin Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 50 days.

(21) Appl. No.: 17/240,330

(22) Filed: Apr. 26, 2021

(65) Prior Publication Data
US 2022/0236907 A1    Jul. 28, 2022

(30) Foreign Application Priority Data
Jan. 22, 2021 (KR) .................. 10-2021-0009645

(51) Int. Cl.
*G11C 7/22* (2006.01)
*G06F 3/06* (2006.01)
*G11C 7/12* (2006.01)

(52) U.S. Cl.
CPC .......... *G06F 3/0655* (2013.01); *G06F 3/0604* (2013.01); *G06F 3/0679* (2013.01); *G11C 7/12* (2013.01); *G11C 7/22* (2013.01); *G11C 2207/22* (2013.01)

(58) Field of Classification Search
CPC ...................................................... G11C 7/12
See application file for complete search history.

(56) References Cited

U.S. PATENT DOCUMENTS

| 6,708,262 B2 | 3/2004 | Manning | |
|---|---|---|---|
| 2019/0312572 A1* | 10/2019 | Kim | ................ G11C 11/40615 |
| 2020/0279588 A1* | 9/2020 | Lym | ..................... G11C 29/021 |

FOREIGN PATENT DOCUMENTS

KR    101975029 B1    8/2019

* cited by examiner

*Primary Examiner* — Min Huang
(74) *Attorney, Agent, or Firm* — William Park & Associates Ltd.

(57) ABSTRACT

A device includes a section signal generation circuit configured to generate a section signal including bits activated during an operation section of each of internal operations included in a mode operation, and a mode command generation circuit configured to generate a mode command for performing the internal operations included in the mode operation from an oscillating signal, based on the section signal.

17 Claims, 20 Drawing Sheets

FIG.16

| LC | LC<6:1> |
|---|---|
| LC1 | '000001' |
| LC2 | '000010' |
| ⋮ | ⋮ |
| LC6 | '000110' |
| ⋮ | ⋮ |
| LC38 | '100110' |
| ⋮ | ⋮ |
| LC43 | '101011' |

DEVICES FOR GENERATING MODE COMMANDS

CROSS-REFERENCE TO RELATED APPLICATIONS

The present application claims priority under 35 U.S.C 119(a) to Korean Application No. 10-2021-0009645, filed on Jan. 22, 2021, which is incorporated herein by reference in its entirety.

BACKGROUND

1. Technical Field

Embodiments of the present disclosure relate to devices for generating mode commands.

2. Related Art

Semiconductor devices may receive commands to perform various internal operations including an active operation, a write operation, a read operation, a pre-charge operation, and the like. Meanwhile, the various internal operations performed by the semiconductor devices may be controlled to be performed at different timings for each mode operation.

SUMMARY

According to an embodiment, a device may include a section signal generation circuit configured to generate a first section signal including bits activated during an operation section of each of internal operations included in a first mode operation, and generate a second section signal including bits activated in an operation section of each of internal operations included in a second mode operation, and a mode command generation circuit configured to generate a first mode command for performing the internal operations included in the first mode operation from an oscillating signal, based on the first section signal, and generate a second mode command for performing the internal operations included in the second mode operation from the oscillating signal, based on the second section signal.

According to an embodiment, a device may include a section signal generation circuit configured to generate a section signal including bits activated during an operation section of each of internal operations included in a mode operation, and a mode command generation circuit configured to generate a mode command for performing the internal operations included in the mode operation from an oscillating signal, based on the section signal.

BRIEF DESCRIPTION OF THE DRAWINGS

FIGS. 13, 14, 15, 16, 17, 18, 19, and 20 are diagrams illustrating operations of the device illustrated in FIG. 1.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a section that the process or the algorithm is executed.

It will be understood that although the terms "first," "second," "third," etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter with reference to the accompanying drawings. However, the embodiments described herein are for illustrative purposes only and are not intended to limit the scope of the present disclosure.

Figure 1:
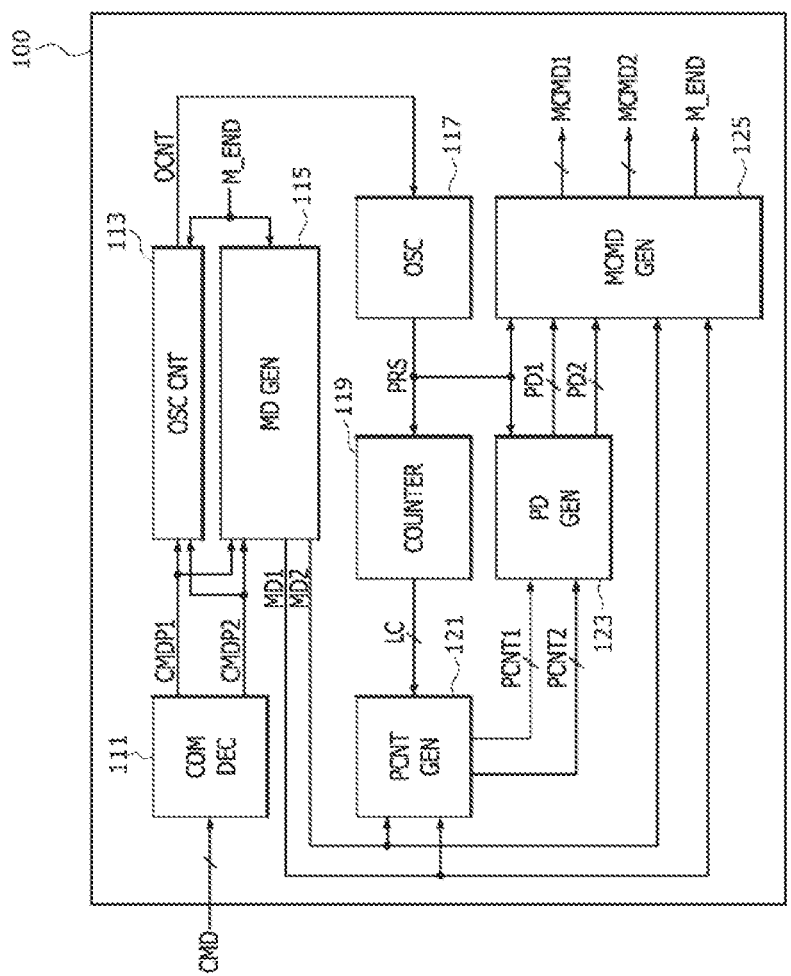
FIG. 1 is a block diagram illustrating a configuration of a device according to an embodiment of the present disclosure.

FIG. 1 is a block diagram illustrating a configuration of a device 100 according to an embodiment of the present disclosure. As illustrated in FIG. 1, the device 100 may include a command decoder (COM DEC) 111, an oscillating control circuit (OSC CNT) 113, a mode signal generation circuit (MD GEN) 115, an oscillator (OSC) 117, a counter 119, a section control signal generation circuit (PCNT GEN) 121, a section signal generation circuit (PD GEN) 123, and a mode command generation circuit (MCMD GEN) 125.

The command decoder 111 may receive a command CMD applied from the outside of the device 100. When the device 100 is a memory device, the outside of the device 100 may be a memory controller (not illustrated). The command decoder 111 may decode the command CMD to generate a first command pulse CMDP1 and a second command pulse CMDP2. Each of the first command pulse CMDP1 and the second command pulse CMDP2 may be activated to perform various mode operations. The mode operations may include various test operations, refresh operations, and the like. For example, when assuming that the mode operations include a first mode operation and a second mode operation, the first command pulse CMDP1 may be activated to perform a memory built in self-test (MBIST) operation set as the first mode operation, and the second command pulse CMDP2 may be activated to perform a refresh operation set as the second mode operation.

The oscillating control circuit 113 may receive the first command pulse CMDP1 and the second command pulse CMDP2 from the command decoder 111. The oscillating control circuit 113 may receive a mode end signal M_END from the mode command generation circuit 125. The oscillating control circuit 113 may generate an oscillating control signal OCNT, based on the first command pulse CMDP1, the second command pulse CMDP2, and the mode end signal M_END. The oscillating control circuit 113 may generate an activated oscillating control signal OCNT when the first command pulse CMDP1 or the second command pulse CMDP2 is activated. The oscillating control circuit 113 may generate a deactivated oscillating control signal OCNT when the mode end signal M_END is activated.

The mode signal generation circuit 115 may receive the first command pulse CMDP1 and the second command pulse CMDP2 from the command decoder 111. The mode signal generation circuit 115 may receive the mode end signal M_END from the mode command generation circuit 125. The mode signal generation circuit 115 may generate a first mode signal MD1 and a second mode signal MD2, based on the first command pulse CMDP1, the second command pulse CMDP2, and the mode end signal M_END. The mode signal generation circuit 115 may generate the first mode signal MD1, based on the first command pulse CMDP1 and the mode end signal M_END. The mode signal generation circuit 115 may generate the first mode signal MD1 activated to perform a first mode operation when the first command pulse CMDP1 is activated. The mode signal generation circuit 115 may generate the second mode signal MD2, based on the second command pulse CMDP2 and the mode end signal M_END. The mode signal generation circuit 115 may generate the second mode signal MD2 activated to perform a second mode operation when the second command pulse CMDP2 is activated. The mode signal generation circuit 115 may generate the second mode signal MD2 deactivated to terminate the second mode operation when the mode end signal M_END is activated.

The oscillator 117 may receive the oscillating control signal OCNT from the oscillating control circuit 113. The oscillator 117 may generate an oscillating signal PRS, based on the oscillating control signal OCNT. The oscillator 117 may generate the oscillating signal PRS that toggles at a preset section when the first mode operation or the second mode operation is performed to activate the oscillating control signal OCNT.

The counter 119 may receive the oscillating signal PRS from the oscillator 117. The counter 119 may generate a latch code LC, based on the oscillating signal PRS. The counter 119 may generate the latch code LC by counting each time the oscillating signal PRS toggles. For example, the counter 119 may count when the oscillating signal PRS toggles every preset section, and generate a latch code LC having a bit set that increases by 1 bit each time the count is performed. When assuming that the latch code LC includes 3 bits, the bit set of the first to third bits LC<3:1> of the latch code may increase by 1 bit in the order of '000', '001', '010', '011', '100', '101', '110', and '111'. When the bit set of the first to third bits LC<3:1> of the latch code is '001', it may mean that the first bit LC<1> of the latch code is a logic "high" level (corresponding to '1') and each of the second and third bits LC<3:2> of the latch code is logic "low" level (corresponding to '0').

The section control signal generation circuit 121 may receive the latch code LC from the counter 119. The section control signal generation circuit 121 may receive the first mode signal MD1 and the second mode signal MD2 from the mode signal generation circuit 115. The section control signal generation circuit 121 may generate a first section control signal PCNT1 and a second section control signal PCNT2, based on the latch code LC, the first mode signal MD1, and the second mode signal MD2. The section control signal generation circuit 121 may generate the first section control signal PDNT1 from the latch code LC, based on the first mode signal MD1. The section control signal generation circuit 121 may generate the first section control signal PCNT1 according to a bit set of the latch code LC when the first mode operation is performed and the first mode signal MD1 is activated. The bit set of the first section control signal PCNT1 may be set to control a timing at which internal operations included in the first mode operation are performed. The section control signal generation circuit 121 may generate the second section control signal PCNT2 from the latch code LC, based on the second mode signal MD2. The section control signal generation circuit 121 may generate the second section control signal PCNT2 according to the bit set of the latch code LC when the second mode operation is performed and the second mode signal MD2 is activated. The bit set of the second section control signal PCNT2 may be set to control a timing at which internal operations included in the second mode operation are performed.

The section signal generation circuit 123 may receive the oscillating signal PRS from the oscillator 117. The section signal generation circuit 123 may receive the first section control signal PCNT1 and the second section control signal PCNT2 from the section control signal generation circuit 121. The section signal generation circuit 123 may generate a first section signal PD1 and a second section signal PD2, based on the oscillating signal PRS, the first section control signal PCNT1, and the second section control signal PCNT2. The section signal generation circuit 123 may generate the first section signal PD1 including bits that are activated during an operation section of each of the internal operations included in the first mode operation, based on the oscillating signal PRS and the first section control signal PCNT1. For example, the section signal generation circuit 123 may generate a first bit PD1<1> of the first section signal which is deactivated to terminate a first internal operation included in the first mode operation, and may generate a second bit PD1<2> of the first section signal which is activated to perform a second internal operation included in the first mode operation when a first bit PCNT1<1> of the first section control signal is first activated, in synchronization with the oscillating signal PRS. In addition, the section signal generation circuit 123 may generate a second bit PD1<2> of the first section signal which is deactivated to terminate the second internal operation included in the first mode operation and may generate a third bit PD1<3> of the first section signal which is activated to perform a third internal operation when a second bit PCNT1<2> of the first section control signal is first activated, in synchronization with the oscillating signal PRS. The first internal operation included in the first mode operation may be performed during a first operation section set from a time when the oscillating signal PRS is activated to a time when the first bit PCNT1<1> of the first section control signal is activated. In addition, the second internal operation included in the first mode operation may be performed during a second operation section set from a time when the first bit PCNT1<1> of the first section control signal is activated to a time when the second bit PCNT1<2> of the first section control signal is activated.

The mode command generation circuit 125 may receive the first mode signal MD1 and the second mode signal MD2 from the mode signal generation circuit 115. The mode command generation circuit 125 may receive the oscillating signal PRS from the oscillator 117. The mode command generation circuit 125 may receive the first section signal PD1 and the second section signal PD2 from the section signal generation circuit 123. The mode command generation circuit 125 may generate a first mode command MCMD1, a second mode command MCMD2, and a mode end signal M_END, based on the first mode signal MD1, the second mode signal MD2, the oscillating signal PRS, the first section signal PD1, and the second section signal PD2. The mode command generation circuit 125 may generate the first mode command MCMD1 from the oscillating signal PRS, based on the first mode signal MD1 and the first section signal PD1. The mode command generation circuit 125 may output the oscillating signal PRS as the first mode command MCMD1 during a section in which the first mode operation is performed to activate the first mode signal MD1 and one of the internal operations included in the first mode operation is performed. The mode command generation circuit 125 may generate the second mode command MCMD2 from the oscillating signal PRS, based on the second mode signal MD2 and the second section signal PD2. The mode command generation circuit 125 may output the oscillating signal PRS as the second mode command MCMD2 during a section in which the second mode operation is performed to activate the second mode signal MD2 and one of the internal operations included in the second mode operation is performed. The mode command generation circuit 125 may generate the mode end signal M_END, based on the first mode signal MD1, the second mode signal MD2, the first section signal PD1, and the second section signal PD2. The mode command generation circuit 125 may generate the mode end signal M_END which is activated when all of the internal operations included in the first mode operation are terminated by the first section signal PD1 while the first mode operation is performed to activate the first mode signal MD1. For example, when first to fifth internal operations are included in the first mode operation, the mode command generation circuit 125 may generate the mode end signal M_END which is activated when a fifth bit PD1<5> of the first section signal is activated. The mode command generation circuit 125 may generate the mode end signal MEND which is activated when all of the internal operations included in the second mode operation are terminated by the second section signal PD2 while the second mode operation is performed to activate the second mode signal MD2. For example, when first to $K^{th}$ internal operations are included in the second mode operation, the mode command generation circuit 125 may generate the mode end signal M_END which is activated when the $K^{th}$ bit PD2<K> of the second section signal is activated. In an embodiment, 'K' may be set to 2 or greater natural number.

Figure 2:
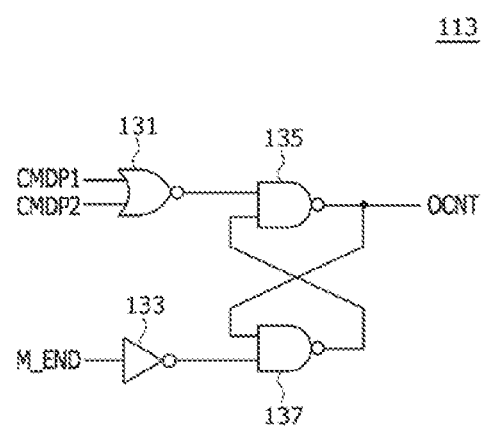
FIG. 2 is a circuit diagram according to an example of an oscillating control circuit included in the device illustrated in FIG. 1.

FIG. 2 is a circuit diagram according to an example of the oscillating control circuit 113 included in the device illustrated in FIG. 1. As illustrated in FIG. 2, the oscillating control circuit 113 may include a NOR gate 131, an inverter 133, and NAND gates 135 and 137. The NOR gate 131 may receive the first command pulse CMDP1 and the second command pulse CMDP2 to perform a logical NOR operation. The inverter 133 may receive and inversely buffer the mode end signal M_END to output the inversely buffered mode end signal. The NAND gate 135 may receive an output signal of the NOR gate 131 and an output signal of the NAND gate 137, and may perform a logical NAND operation to generate an oscillating control signal OCNT. The NAND gate 137 may receive an output signal of the inverter 133 and an output signal of the NAND gate 135, and may perform a logical NAND operation. The oscillating control circuit 113 may generate the oscillating control signal OCNT which is activated to a logic "high" level when at least one of the first command pulse CMDP1 and the second command pulse CMDP2 is activated to a logic "high" level. The oscillating control circuit 113 may generate the oscillating control signal OCNT which is deactivated to a logic "low" level when the mode end signal M_END is activated to a logic "high" level.

Figure 3:
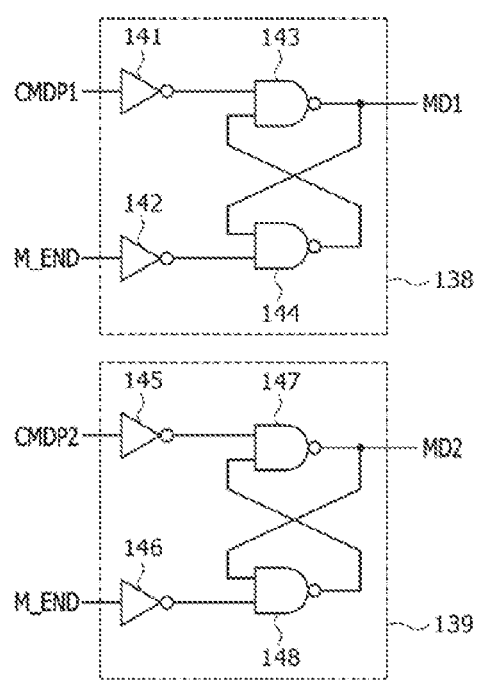
FIG. 3 is a circuit diagram according to an example of a mode signal generation circuit included in the device illustrated in FIG. 1.

FIG. 3 is a circuit diagram according to an example of the mode signal generation circuit 115 included in the device illustrated in FIG. 1. As illustrated in FIG. 3, the mode signal generation circuit 115 may include a first mode signal generator 138 and a second mode signal generator 139.

The first mode signal generator 138 may include inverters 141 and 142, and NAND gates 143 and 144. The inverter 141 may inversely buffer the first command pulse CMDP1 to output the inversely buffered signal of the first command pulse CMDP1. The inverter 142 may inversely buffer the mode end signal M_END to output the inversely buffered signal of the mode end signal M_END. The NAND gate 143 may receive an output signal of the inverter 141 and an output signal of the NAND gate 144, and may perform a logical NAND operation to generate the first mode signal MD1. The NAND gate 144 may receive an output signal of the inverter 142 and an output signal of the NAND gate 143, and may perform a logical NAND operation. The first mode signal generator 138 may generate the first mode signal MD1 which is activated to a logic "high" level when the first mode operation is performed to activate the first command pulse CMDP1 to a logic "high" level. The first mode signal generator 138 may generate the first mode signal MD1 which is deactivated to a logic "low" level when the first mode operation is terminated to activate the mode end signal M_END to a logic "high" level.

The second mode signal generator 139 may include inverters 145 and 146, and NAND gates 147 and 148. The inverter 145 may inversely buffer the second command pulse CMDP2 to output the inversely buffered signal of the second command pulse CMDP2. The inverter 146 may inversely buffer the mode end signal M_END to output the inversely buffered signal of the mode end signal M_END. The NAND gate 147 may receive an output signal of the inverter 145 and an output signal of the NAND gate 148, and may perform a logical NAND operation to generate the second mode signal MD2. The NAND gate 148 may receive an output signal of the inverter 146 and an output signal of the NAND gate 147, and may perform a logical NAND operation. The second mode signal generator 139 may generate the second mode signal MD2 which is activated to a logic "high" level when the second mode operation is performed to activate the second command pulse CMDP2 to a logic "high" level. The second mode signal generator 139 may generate the second mode signal MD2 which is deactivated to a logic "low" level when the second mode operation is terminated to activate the mode end signal M_END to a logic "high" level.

Figure 4:
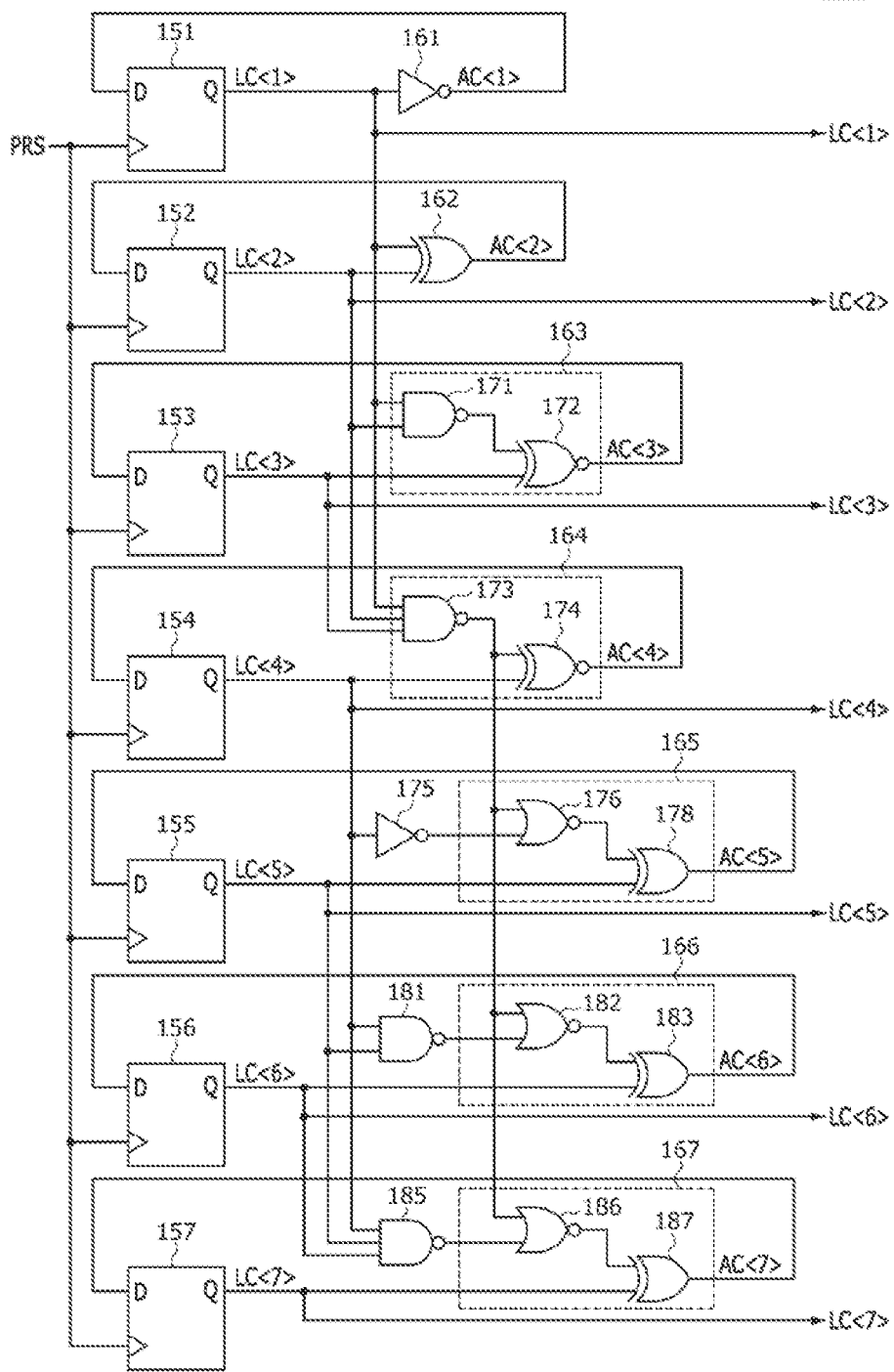
FIG. 4 is a circuit diagram according to an example of a counter included in the device illustrated in FIG. 1.

FIG. 4 is a circuit diagram according to an example of the counter 119 included in the device illustrated in FIG. 1. As illustrated in FIG. 4, the counter 119 may include a first latch code generator 151, a first adder 161, a second latch code generator 152, a second adder 162, a third latch code generator 153, a third adder 163, a fourth latch code generator 154, a fourth adder 164, a fifth latch code generator 155, a fifth adder 165, a sixth latch code generator 156, a sixth adder 166, a seventh latch code generator 157, and a seventh adder 167.

The first latch code generator 151 may be implemented as a D flip-flop. The first latch code generator 151 may latch a first bit AC<1> of an addition code output from the first adder 161, based on the oscillating signal PRS, and may output the latched first bit AC<1> of the addition code as a first bit LC<1> of the latch code. The first adder 161 may be implemented as an inverter. The first adder 161 may inversely buffer the first bit LC<1> of the latch code to output the inversely buffered first bit of the latch code as the first bit AC<1> of the addition code.

The second latch code generator 152 may be implemented as a D flip-flop. The second latch code generator 152 may latch a second bit AC<2> of the addition code output from the second adder 162, based on the oscillating signal PRS, and may output the latched second bit AC<2> of the addition code as a second bit LC<2> of the latch code. The second adder 162 may be implemented as an exclusive OR gate. The second adder 162 may receive the first bit LC<1> of the latch code and the second bit LC<2> of the latch code, and may perform a logical exclusive OR operation to generate the second bit AC<2> of the addition code.

The third latch code generator 153 may be implemented as a D flip-flop. The third latch code generator 153 may latch a third bit AC<3> of the addition code output from the third adder 163, based on the oscillating signal PRS, and may output the latched third bit AC<3> of the addition code as a third bit LC<3> of the latch code. The third adder 163 may be implemented as a NAND gate 171 and an exclusive NOR gate 172. The NAND gate 171 may receive the first bit LC<1> of the latch code and the second bit LC<2> of the latch code, and may perform a logical NAND operation. The exclusive NOR gate 172 may receive an output signal of the NAND gate 171 and the third bit LC<3> of the latch code, and may perform a logical exclusive NOR operation to generate the third bit AC<3> of the addition code.

The fourth latch code generator 154 may be implemented as a D flip-flop. The fourth latch code generator 154 may latch a fourth bit AC<4> of the addition code output from the fourth adder 164, based on the oscillating signal PRS, and may output the latched fourth bit AC<4> of the addition code as a fourth bit LC<4> of the latch code. The fourth adder 164 may be implemented as a NAND gate 173 and an exclusive NOR gate 174. The NAND gate 173 may receive the first bit LC<1> of the latch code, the second bit LC<2> of the latch code, and the third bit LC<3> of the latch code, and may perform a logical NAND operation. The exclusive NOR gate 174 may receive an output signal of the NAND gate 173 and the fourth bit LC<4> of the latch code, and may perform a logical exclusive NOR operation to generate the fourth bit AC<4> of the addition code.

The fifth latch code generator 155 may be implemented as a D flip-flop. The fifth latch code generator 155 may latch a fifth bit AC<5> of the addition code output from the fifth adder 165, based on the oscillating signal PRS, and may output the latched fifth bit AC<5> of the addition code as a fifth bit LC<5> of the latch code. The fifth adder 165 may be implemented as an inverter 175, a NOR gate 176, and an exclusive OR gate 178. The inverter 175 may inversely buffer the fourth bit LC<4> of the latch code. The NOR gate 176 may receive an output signal of the inverter 175 and an output signal of the NAND gate 173, and may perform a logical NOR operation. The exclusive OR gate 178 may receive an output signal of the NOR gate 176 and the fifth bit LC<5> of the latch code, and may perform a logical exclusive OR operation to generate the fifth bit AC<5> of the addition code.

The sixth latch code generator 156 may be implemented as a D flip-flop. The sixth latch code generator 156 may latch a sixth bit AC<6> of the addition code output from the sixth adder 166, based on the oscillating signal PRS, and may output the latched sixth bit AC<6> of the addition code as a sixth bit LC<6> of the latch code. The sixth adder 166 may be implemented as a NAND gate 181, a NOR gate 182, and an exclusive OR gate 183. The NAND gate 181 may receive the fourth bit LC<4> of the latch code and the fifth bit LC<5> of the latch code, and may perform a logical NAND operation. The NOR gate 182 may receive an output signal of the NAND gate 181 and the output signal of the NAND gate 173, and may perform a logical NOR operation. The exclusive OR gate 183 may receive an output signal of the NOR gate 182 and the sixth bit LC<6> of the latch code, and may perform a logical exclusive OR operation to generate the sixth bit AC<6> of the addition code.

The seventh latch code generator 157 may be implemented as a D flip-flop. The seventh latch code generator 157 may latch a seventh bit AC<7> of the addition code output from the seventh adder 167, based on the oscillating signal PRS, and may output the latched seventh bit AC<7> of the addition code as a seventh bit LC<7> of the latch code. The seventh adder 167 may be implemented as a NAND gate 185, a NOR gate 186, and an exclusive OR gate 187. The NAND gate 185 may receive the fourth bit LC<4> of the latch code, the fifth bit LC<5> of the latch code, and the sixth bit LC<6> of the latch code, and may perform a logical NAND operation. The NOR gate 186 may receive an output signal of the NAND gate 185 and the output signal of the NAND gate 173, and may perform a logical NOR operation. The exclusive OR gate 187 may receive an output signal of the NOR gate 186 and the seventh bit LC<7> of the latch code, may and perform a logical exclusive OR operation to generate the seventh bit AC<7> of the addition code.

Figure 5:
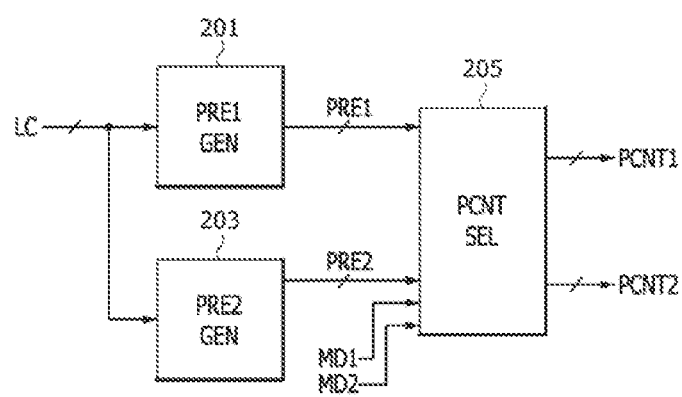
FIG. 5 is a block diagram illustrating a configuration according to an example of a section control signal generation circuit included in the device illustrated in FIG. 1.

FIG. 5 is a block diagram illustrating a configuration according to an example of the section control signal generation circuit 121 included in the device illustrated in FIG. 1. As illustrated in FIG. 5, the section control signal generation circuit 121 may include a first pre-signal generator 201, a second pre-signal generator 203, and a section control signal selector 205.

The first pre-signal generator 201 may generate a first pre-signal PRE1, based on the latch code LC. The first pre-signal generator 201 may generate the first pre-signal PRE1 according to a bit set of the latch code LC in a first mode operation. The bit set of the first pre-signal PRE1 may be set to control the timing of the internal operations in the first mode operation. The number of bits included in the first pre-signal PRE1 may be determined according to the number of the internal operations included in the first mode operation. For example, when five internal operations are included in the first mode operation, the number of bits included in the first pre-signal PRE1 may be set to five. In addition, the number of bits included in the latch code LC used to set the bit set of the first pre-signal PRE1 may be variously set according to embodiments.

The second pre-signal generator 203 may generate a second pre-signal PRE2, based on the latch code LC. The second pre-signal generator 203 may generate the second pre-signal PRE2 according to the bit set of the latch code LC in a second mode operation. The bit set of the second pre-signal PRE2 may be set to control the timing of the internal operations in the second mode operation. The number of bits included in the second pre-signal PRE2 may be determined according to the number of the internal operations included in the second mode operation. For example, when K internal operations are included in the second mode operation, the number of bits included in the second pre-signal PRE2 may be set to K. In addition, the number of bits included in the latch code LC used to set the bit set of the second pre-signal PRE2 may be variously set according to embodiments.

The section control signal selector 205 may generate a first section control signal PCNT1 and a second section control signal PCNT2 from the first pre-signal PRE1 and the second pre-signal PRE2, based on a first mode signal MD1 and a second mode signal MD2. The section control signal selector 205 may buffer the first pre-signal PRE1 to generate the first section control signal PCNT1 when the first mode signal MD1 is activated for the first mode operation. The section control signal selector 205 may buffer the second pre-signal PRE2 to generate the second section control signal PCNT2 when the second mode signal MD2 is activated for the second mode operation.

Figure 6:
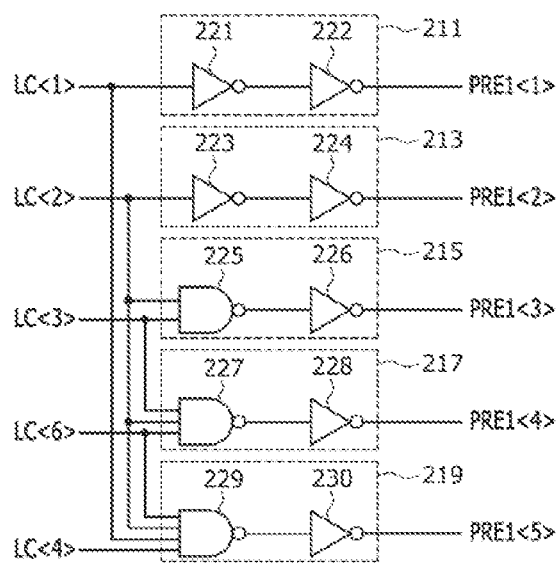
FIG. 6 is a circuit diagram according to an example of a first pre-signal generator included in the section control signal generation circuit illustrated in FIG. 5.

FIG. 6 is a circuit diagram according to an example of the first pre-signal generator 201 included in the section control signal generation circuit illustrated in FIG. 5. As illustrated in FIG. 6, the first pre-signal generator 201 may include a first logic unit 211, a second logic unit 213, a third logic unit 215, a fourth logic unit 217, and a fifth logic unit 219. In an embodiment, the second pre-signal generator 203 may be configured in the same way as the first pre-signal generator 201 except that the designations of the signals being received and output and as such for brevity will not be discussed in detail.

The first logic unit 211 may include inverters 221 and 222. The inverter 221 may inversely buffer the first bit LC<1> of the latch code. The inverter 222 may inversely buffer an output signal of the inverter 221 to generate a first bit PRE1<1> of the first pre-signal. The first logic unit 211 may buffer the first bit LC<1> of the latch code to generate the first bit PRE1<1> of the first pre-signal.

The second logic unit 213 may include inverters 223 and 224. The inverter 223 may inversely buffer a second bit LC<2> of the latch code. The inverter 224 may inversely buffer an output signal of the inverter 223 to generate a second bit PRE1<2> of the first pre-signal. The second logic unit 213 may buffer the second bit LC<2> of the latch code to generate the second bit PRE1<2> of the first pre-signal.

The third logic unit 215 may include a NAND gate 225 and an inverter 226. The NAND gate 225 may receive the second bit LC<2> of the latch code and the third bit LC<3> of the latch code, and may perform a logical NAND operation. The inverter 226 may inversely buffer an output signal of the NAND gate 225 to generate a third bit PRE1<3> of the first pre-signal. The third logic unit 215 may receive the second bit LC<2> of the latch code and the third bit LC<3> of the latch code, and may perform a logical AND operation to generate the third bit PRE1<3> of the first pre-signal.

The fourth logic unit 217 may include a NAND gate 227 and an inverter 228. The NAND gate 227 may receive the second bit LC<2> of the latch code, the third bit LC<3> of the latch code, and a sixth bit LC<6> of the latch code, and may perform a logical NAND operation. The inverter 228 may inversely buffer an output signal of the NAND gate 227 to generate a fourth bit PRE1<4> of the first pre-signal. The fourth logic unit 217 may receive the second bit LC<2> of the latch code, the third bit LC<3> of the latch code, and the sixth bit LC<6> of the latch code, and may perform a logical AND operation to generate the fourth bit PRE1<4> of the first pre-signal.

The fifth logic unit 219 may include a NAND gate 229 and an inverter 230. The NAND gate 229 may receive the first bit LC<1> of the latch code, the second bit LC<2> of the latch code, a fourth bit LC<4> of the latch code, and the sixth bit LC<6> of the latch code, and may perform a logical NAND operation. The inverter 230 may inversely buffer an output signal of the NAND gate 229 to generate a fifth bit PRE1<5> of the first pre-signal. The fifth logic unit 219 may receive the first bit LC<1> of the latch code, the second bit LC<2> of the latch code, the fourth bit LC<4> of the latch code, and the sixth bit LC<6> of the latch code, and may perform a logical AND operation to generate the fifth bit PRE1<5> of the first pre-signal.

The first bit PRE1<1> of the first pre-signal may be activated to a logic "high" level for the first time when the first to sixth bits LC<6:1> of the latch code are set to '000001'. When the first bit PRE1<1> of the first pre-signal is activated to a logic "high" level for the first time, a second internal operation included in a first mode operation may be performed and a first internal operation included in the first mode operation may be terminated. The second bit PRE1<2> of the first pre-signal may be activated to a logic "high" level for the first time when the first to sixth bits LC<6:1> of the latch code are set to '000010'. When the second bit PRE1<2> of the first pre-signal is activated to a logic "high" level for the first time, a third internal operation included in the first mode operation may be performed and the second internal operation included in the first mode operation may be terminated. The third bit PRE1<3> of the first pre-signal may be activated to a logic "high" level for the first time when the first to sixth bits LC<6:1> of the latch code are set to '000110'. When the third bit PRE1<3> of the first pre-signal is activated to a logic "high" level for the first time, a fourth internal operation included in the first mode operation may be performed and the third internal operation included in the first mode operation may be terminated. The fourth bit PRE1<4> of the first pre-signal may be activated to a logic "high" level for the first time when the first to sixth bits LC<6:1> of the latch code are set to '100110'. When the fourth bit PRE1<4> of the first pre-signal is activated to the logic "high" level for the first time, a fifth internal operation included in the first mode operation may be performed and the fourth internal operation included in the first mode operation may be terminated. The fifth bit PRE1<5> of the first pre-signal may be activated to a logic "high" level for the first time when the first to sixth bits LC<6:1> of the latch code are set to '101011'. When the fifth bit PRE1<5> of the first pre-signal is activated to a logic "high" level for the first time, the fifth internal operation included in the first mode operation may be terminated.

Figure 7:
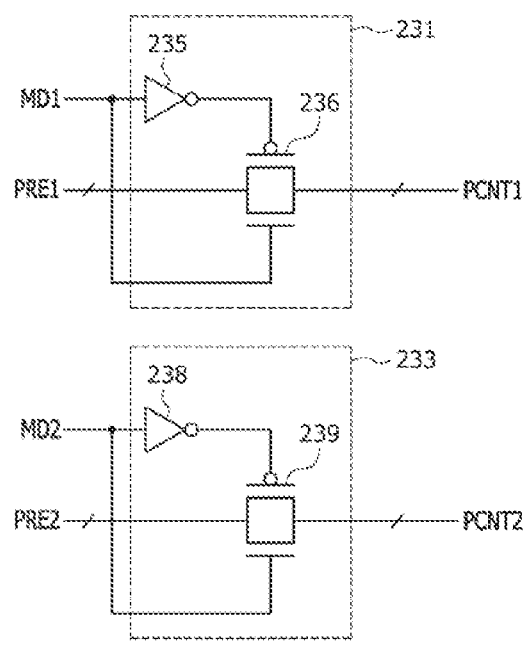
FIG. 7 is a circuit diagram according to an example of a section control signal selector included in the section control signal generation circuit illustrated in FIG. 5.

FIG. 7 is a circuit diagram according to an example of a section control signal selector 205 included in the section control signal generation circuit illustrated in FIG. 5. As illustrated in FIG. 7, the section control signal selector 205 may include a first section control signal selector 231 and a second section control signal selector 233.

The first section control signal selector 231 may include an inverter 235 and a transfer gate 236. The inverter 235 may inversely buffer a first mode signal MD1. The transfer gate 236 may be turned on when an output signal of the inverter 235 has a logic "high" level. The first section control signal selector 231 may buffer the first pre-signal PRE1 to generate the first section control signal PCNT1 when the first mode signal MD1 is activated to a logic "high" level for the first mode operation.

The second section control signal selector 233 may include an inverter 238 and a transfer gate 239. The inverter 238 may inversely buffer a second mode signal MD2. The transfer gate 239 may be turned on when an output signal of the inverter 238 has a logic "high" level. The second section control signal selector 233 may buffer the second pre-signal PRE2 to generate the second section control signal PCNT2 when the second mode signal MD2 is activated to a logic "high" level for the second mode operation.

Figure 8:
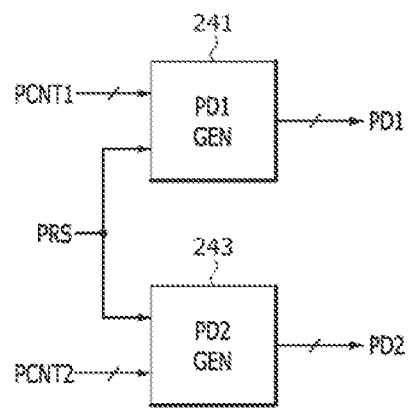
FIG. 8 is a block diagram illustrating a configuration according to an example of a section signal generation circuit included in the device illustrated in FIG. 1.

FIG. 8 is a block diagram illustrating a configuration according to an example of the section signal generation circuit 123 included in the device illustrated in FIG. 1. As illustrated in FIG. 8, the section signal generation circuit 123 may include a first section signal generator 241 and a second section signal generator 243.

The first section signal generator 241 may generate the first section signal PD1, based on the oscillating signal PRS and the first section control signal PCNT1. The first section signal generator 241 may generate the first section signal PD1 for setting the operation section of each of the internal operations included in the first mode operation from the first section control signal PCNT1 in synchronization with the oscillating signal PRS. The section in which each of the bits included in the first section signal PD1 is activated may correspond to the operation section of each of the internal operations included in the first mode operation. For example, when a first internal operation and a second internal operation are included in the first mode operation, a first bit PD1<1> of the first section signal may be activated during a first operation section in which the first internal operation included in the first mode operation is performed, and a second bit PD1<2> of the first section signal may be activated during a second operation section in which the second internal operation included in the first mode operation is performed.

The second section signal generator 243 may generate the second section signal PD2, based on the oscillating signal PRS and the second section control signal PCNT2. The second section signal generator 243 may generate the second section signal PD2 for setting the operation section of each of the internal operations included in the second mode operation from the second section control signal PCNT2 in synchronization with the oscillating signal PRS. The section in which each of the bits included in the second section signal PD2 is activated may correspond to the operation section of each of the internal operations included in the second mode operation.

Figure 9:
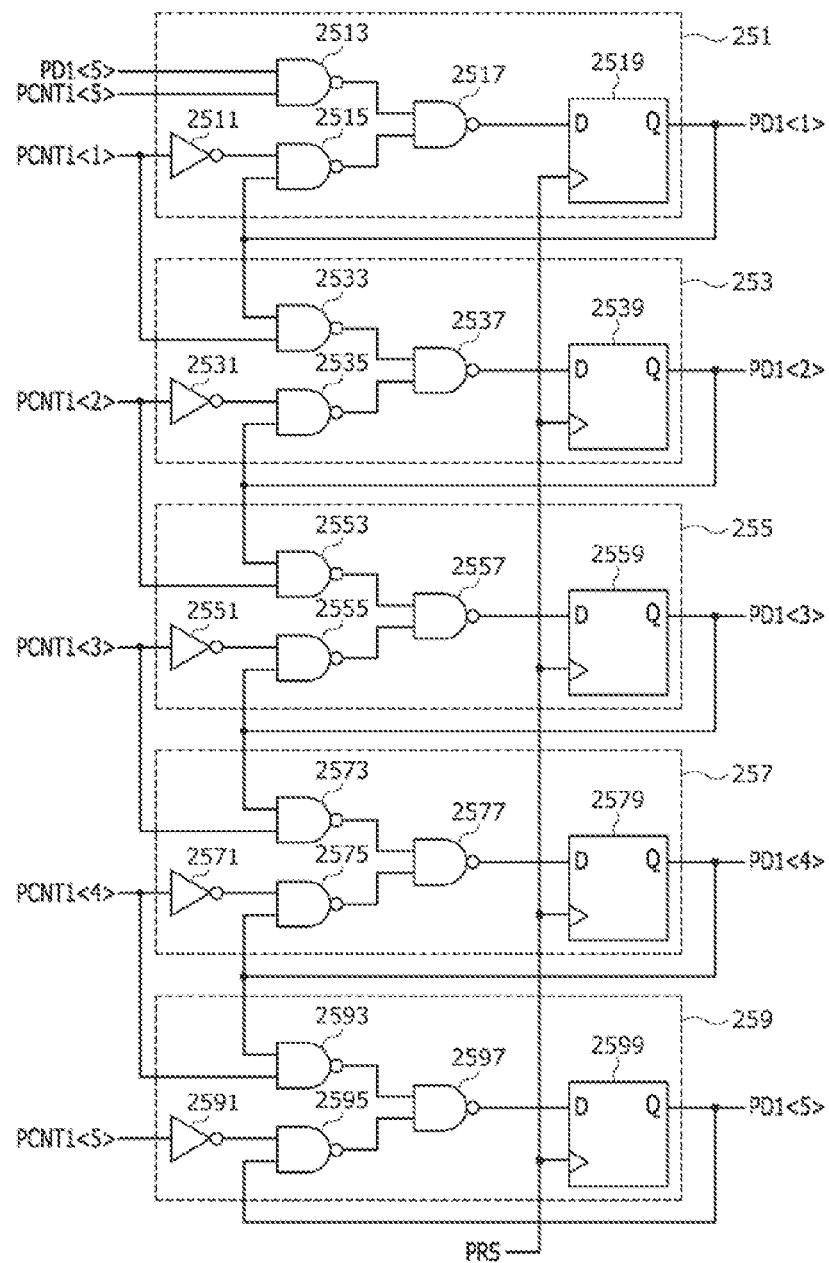
FIG. 9 is a circuit diagram according to an example of a first section signal generator included in the section signal generation circuit illustrated in FIG. 8.

FIG. 9 is a circuit diagram according to an example of the first section signal generator 241 included in the section signal generation circuit illustrated in FIG. 8. As illustrated in FIG. 9, the first section signal generator 241 may include a first section control circuit 251, a second section control circuit 253, a third section control circuit 255, a fourth section control circuit 257, and a fifth section control circuit 259. Hereinafter, it is assumed that first to fifth internal operations are included in the first mode operation.

The first section control circuit 251 may include an inverter 2511, NAND gates 2513, 2515, and 2517, and a first section signal latch 2519. The inverter 2511 may inversely buffer a first bit PCNT1<1> of the first section control signal. The NAND gate 2513 may receive a fifth bit PD1<5> of the first section signal and a fifth bit PCNT1<5> of the first section control signal, and may perform a logical NAND operation. The NAND gate 2515 may receive an output signal of the inverter 2511 and a first bit PD1<1> of the first section signal, and may perform a logical NAND operation. The NAND gate 2517 may receive an output signal of the NAND gate 2513 and an output signal of the NAND gate 2515, and may perform a logical NAND operation. The first section signal latch 2519 may latch an output signal of the NAND gate 2517 in synchronization with the oscillating signal PRS, and may output the latched output signal of the NAND gate 2517 as the first bit PD1<1> of the first section signal. The first section control circuit 251 may generate the first bit PD1<1> of the first section signal which is deactivated to a logic "low" level to terminate the first internal operation included in the first mode operation when the first bit PCNT1<1> of the first section control signal is activated to a logic "high" level. The first section control circuit 251 may generate the first bit PD1<1> of the first section signal which is activated to a logic "high" level when the fifth bit PCNT1<5> of the first section control signal is activated to a logic "high" level and the fifth internal operation included in the first mode operation is terminated.

The second section control circuit 253 may include an inverter 2531, NAND gates 2533, 2535, and 2537, and a second section signal latch 2539. The inverter 2531 may inversely buffer the second bit PCNT1<2> of the first section control signal. The NAND gate 2533 may receive the first bit PD1<1> of the first section signal and the first bit PCNT1<1> of the first section control signal, and may perform a logical NAND operation. The NAND gate 2535 may receive an output signal of the inverter 2531 and the second bit PD1<2> of the first section signal, and may perform a logical NAND operation. The NAND gate 2537 may receive an output signal of the NAND gate 2533 and an output signal of the NAND gate 2535, and may perform a logical NAND operation. The second section signal latch 2539 may latch an output signal of the NAND gate 2537 in synchronization with the oscillating signal PRS, and may output the latched output signal of the NAND gate 2537 as the second bit PD1<2> of the first section signal. The second section control circuit 253 may generate the second bit PD1<2> of the first section signal that is activated to a logic "high" level to perform the second internal operation included in the first mode operation when the first bit PCNT1<1> of the first section control signal is activated to a logic "high" level. The second section control circuit 253 may generate the second bit PD1<2> of the first section signal which is deactivated to a logic "low" level to terminate the second internal operation included in the first mode operation when the second bit PCNT1<2> of the first section control signal is activated to a logic "high" level.

The third section control circuit 255 may include an inverter 2551, NAND gates 2553, 2555, and 2557, and a third section signal latch 2559. The inverter 2551 may inversely buffer a third bit PCNT1<3> of the first section control signal. The NAND gate 2553 may receive the second bit PD1<2> of the first section signal and the second bit PCNT1<2> of the first section control signal, and may perform a logical NAND operation. The NAND gate 2555 may receive an output signal of the inverter 2551 and the third bit PD1<3> of the first section signal, and may perform a logical NAND operation. The NAND gate 2557 may receive an output signal of the NAND gate 2553 and an output signal of the NAND gate 2555, and may perform a logical NAND operation. The third section signal latch 2559 may latch an output signal of the NAND gate 2557 in synchronization with the oscillating signal PRS, and may output the latched output signal of the NAND gate 2557 as the third bit PD1<3> of the first section signal. The third section control circuit 255 may generate the third bit PD1<3> of the first section signal which is activated to a logic "high" level to perform a third internal operation included in the first mode operation when the second bit PCNT1<2> of the first section control signal is activated to a logic "high" level. The third section control circuit 255 may generate the third bit PD1<3> of the first section signal that is deactivated to a logic "low" level to terminate the third internal operation included in the first mode operation when the third bit PCNT1<3> of the first section control signal is activated to a logic "high" level.

The fourth section control circuit 257 may include an inverter 2571, NAND gates 2573, 2575, and 2577, and a fourth section signal latch 2579. The inverter 2571 may inversely buffer a fourth bit PCNT1<4> of the first section control signal. The NAND gate 2573 may receive the third bit PD1<3> of the first section signal and the third bit PCNT1<3> of the first section control signal, and may perform a logical NAND operation. The NAND gate 2575 may receive an output signal of the inverter 2571 and a fourth bit PD1<4> of the first section signal, and may perform a logical NAND operation. The NAND gate 2577 may receive an output signal of the NAND gate 2573 and an output signal of the NAND gate 2575, and may perform a logical NAND operation. The fourth section signal latch 2579 may latch an output signal of the NAND gate 2577 in synchronization with the oscillating signal PRS, and may output the latched output signal of the NAND gate 2577 as the fourth bit PD1<4> of the first section signal. The fourth section control circuit 257 may generate the fourth bit PD1<4> of the first section signal that is activated to a logic "high" level to perform a fourth internal operation included in the first mode operation when the third bit PCNT1<3> of the first section control signal is activated to a logic "high" level. The fourth section control circuit 257 may generate the fourth bit PD1<4> of the first section signal that is deactivated to a logic "low" level to terminate the fourth internal operation included in the first mode operation when the fourth bit PCNT1<4> of the first section control signal is activated to a logic "high" level.

The fifth section control circuit 259 may include an inverter 2591, NAND gates 2593, 2595, and 2597, and a fifth section signal latch 2599. The inverter 2591 may inversely buffer a fifth bit PCNT1<5> of the first section control signal. The NAND gate 2593 may receive the fourth bit PD1<4> of the first section signal and the fourth bit PCNT1<4> of the first section control signal, and may perform a logical NAND operation. The NAND gate 2595 may receive an output signal of the inverter 2591 and a fifth bit PD1<5> of the first section signal, and may perform a logical NAND operation. The NAND gate 2597 may receive an output signal of the NAND gate 2593 and an output signal of the NAND gate 2595, and may perform a logical NAND operation. The fifth section signal latch 2599 may latch an output signal of the NAND gate 2597 in synchronization with the oscillating signal PRS, and may output the latched output signal of the NAND gate 2597 as the fifth bit PD1<5> of the first section signal. The fifth section control circuit 259 may generate the fifth bit PD1<5> of the first section signal which is activated to a logic "high" level to perform a fifth internal operation included in the first mode operation when the fourth bit PCNT1<4> of the first section control signal is activated to a logic "high" level. The fifth section control circuit 259 may generate the fifth bit PD1<5> of the first section signal which is deactivated to a logic "low" level to terminate the fifth internal operation included in the first mode operation when the fifth bit PCNT1<5> of the first section control signal is activated to a logic "high" level.

Figure 10:
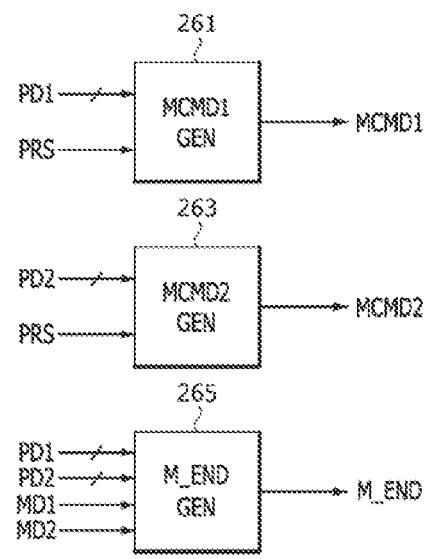
FIG. 10 is a block diagram illustrating a configuration according to an example of a mode command generation circuit included in the device illustrated in FIG. 1.

FIG. 10 is a block diagram illustrating a configuration according to an example of the mode command generation circuit 125 included in the device illustrated in FIG. 1. As illustrated in FIG. 10, the mode command generation circuit 125 may include a first mode command generator 261, a second mode command generator 263, and a mode end signal generator 265.

The first mode command generator 261 may generate a first mode command MCMD1 from the oscillating signal PRS, based on the first section signal PD1. The first mode command generator 261 may output the oscillating signal PRS as the first mode command MCMD1 during an operation section in which each of the internal operations included in the first mode operation is performed. For example, the first mode command generator 261 may output the oscillating signal PRS as a first bit MCMD1<1> of the first mode command during a section in which the first bit PD1<1> of the first section signal is activated. The first bit MCMD1<1> of the first mode command is generated during a first operation section in which the first internal operation included in the first mode operation is performed.

The second mode command generator 263 may generate a second mode command MCMD2 from the oscillating signal PRS, based on the second section signal PD2. The second mode command generator 263 may output the oscillating signal PRS as the second mode command MCMD2 during an operation section in which each of the internal operations included in the second mode operation is performed. For example, the second mode command generator 263 may output the oscillating signal PRS as a second bit MCMD2<2> of the second mode command during a section in which the second bit PD2<2> of the second section signal is activated. The second bit MCMD2<2> of the second mode command is generated during a second operation section in which the second internal operation included in the second mode operation is performed.

The mode end signal generator 265 may generate a mode end signal M_END, based on the first mode signal MD1, the second mode signal MD2, the first section signal PD1, and the second section signal PD2. The mode end signal generator 265 may generate the mode end signal M_END which is activated when all of the internal operations included in the first mode operation are terminated by the first section signal PD1 while the first mode operation is performed to activate the first mode signal MD1. The mode end signal generator 265 may generate the mode end signal M_END which is activated when all of the internal operations included in the second mode operation are terminated by the second section signal PD2 while the second mode operation is performed to activate the second mode signal MD2.

Figure 11:
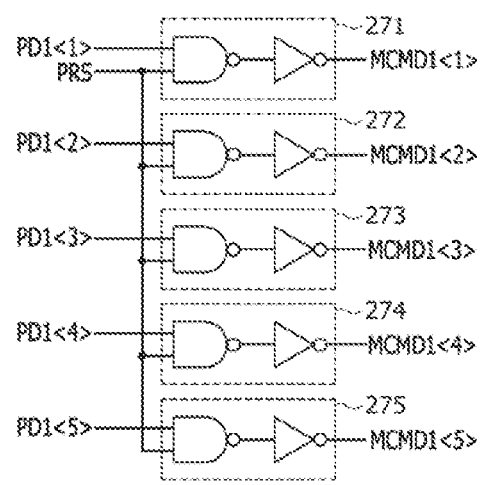
FIG. 11 is a circuit diagram according to a first mode command generator included in the mode command generation circuit illustrated in FIG. 10.

FIG. 11 is a circuit diagram according to the first mode command generator 261 included in the mode command generation circuit illustrated in FIG. 10. As illustrated in FIG. 11, the first mode command generator circuit 261 may include a first section logic unit 271, a second section logic unit 272, a third section logic unit 273, a fourth section logic unit 274, and a fifth section logic unit 275. In an embodiment, the second mode command generator 263 may be configured in the same was as the first mode command generator 261 except that the designations of the signals being received and output and as such for brevity will not be discussed in detail.

The first section logic unit 271 may generate a first bit MCMD1<1> of the first mode command, based on a first bit PD1<1> of the first section signal and the oscillating signal PRS. The first section logic unit 271 may receive the first bit PD1<1> of the first section signal and the oscillating signal PRS, and may perform a logical AND operation to generate the first bit MCMD1<1> of the first mode command. The first section logic unit 271 may output the oscillating signal PRS as the first bit MCMD1<1> of the first mode command during a first operation section in which a first internal operation included in the first mode operation is performed.

The second section logic unit 272 may generate a second bit MCMD1<2> of the first mode command, based on a second bit PD1<2> of the first section signal and the oscillating signal PRS. The second section logic unit 272 may receive the second bit PD1<2> of the first section signal and the oscillating signal PRS, and may perform a logical AND operation to generate the second bit MCMD1<2> of the first mode command. The second section logic unit 272 may output the oscillating signal PRS as the second bit MCMD1<2> of the first mode command during a second operation section in which a second internal operation included in the first mode operation is performed.

The third section logic unit 273 may generate a third bit MCMD1<3> of the first mode command, based on the third bit PD1<3> of the first section signal and the oscillating signal PRS. The third section logic unit 273 may receive the third bit PD1<3> of the first section signal and the oscillating signal PRS, and may perform a logical AND operation to generate the third bit MCMD1<3> of the first mode command. The third section logic unit 273 may output the oscillating signal PRS as the third bit MCMD1<3> of the first mode command during a third operation section in which a third internal operation included in the first mode operation is performed.

The fourth section logic unit 274 may generate a fourth bit MCMD1<4> of the first mode command, based on the fourth bit PD1<4> of the first section signal and the oscillating signal PRS. The fourth section logic unit 274 may receive the fourth bit PD1<4> of the first section signal and the oscillating signal PRS, and may perform a logical AND operation to generate the fourth bit MCMD1<4> of the first mode command. The fourth section logic unit 274 may output the oscillating signal PRS as the fourth bit MCMD1<4> of the first mode command during a fourth operation section in which a fourth internal operation included in the first mode operation is performed.

The fifth section logic unit 275 may generate a fifth bit MCMD1<5> of the first mode command, based on a fifth bit PD1<5> of the first section signal and the oscillating signal PRS. The fifth section logic unit 275 may receive the fifth bit PD1<5> of the first section signal and the oscillating signal PRS, and may perform a logical AND operation to generate the fifth bit MCMD1<5> of the first mode command. The fifth section logic unit 275 may output the oscillating signal PRS as the fifth bit MCMD1<5> of the first mode command during a fifth operation section in which a fifth internal operation included in the first mode operation is performed.

Figure 12:
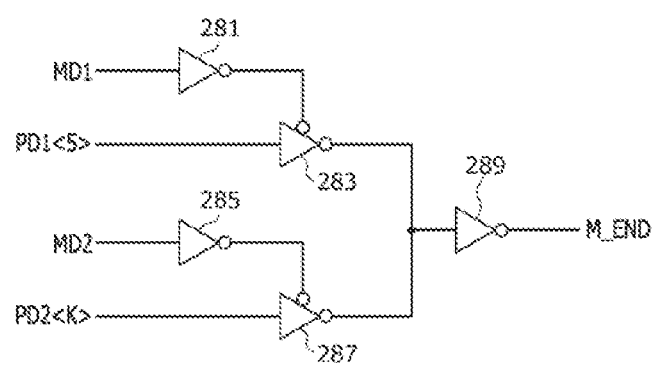
FIG. 12 is a circuit diagram according to an example of a mode end signal generator included in the mode command generation circuit illustrated in FIG. 10.

FIG. 12 is a circuit diagram according to an example of the mode end signal generator 265 included in the mode command generation circuit illustrated in FIG. 10. As illustrated in FIG. 12, the mode end signal generator 265 may include inverters 281, 283, 285, 287, and 289. The inverter 281 may inversely buffer a first mode signal MD1. The inverter 283 may inversely buffer a fifth bit PD1<5> of the first section signal, based on an output signal of the inverter 281. The inverter 283 may inversely buffer the fifth bit PD1<5> of the first section signal when the first mode operation is performed. The inverter 285 may inversely buffer a second mode signal MD2. The inverter 287 may inversely buffer a $K^{th}$ bit PD2<K> of the second section signal, based on an output signal of the inverter 285. The inverter 287 may inversely buffer a K bit PD2<K> of the second section signal when the second mode operation is performed. The inverter 289 may inversely buffer an output signal of the inverter 283 to output the inversely buffered signal of the output signal of the inverter 283 as a mode end signal M_END when the first mode operation is performed. The inverter 289 may inversely buffer an output signal of the inverter 287 to output the inversely buffered signal of the output signal of the inverter 287 as the mode end signal M_END when the second mode operation is performed. The mode end signal generator 265 may buffer the fifth bit PD1<5> of the first section signal which is activated to a logic "high" level when the fifth internal operation included in the first mode operation is terminated to generate the mode end signal M_END activated to a logic "high" level. In the present embodiment, it is assumed that the first mode operation includes the first to fifth internal operations, but this is only an embodiment and the present disclosure is not limited thereto. The mode end signal generator 265 may buffer the $K^{th}$ bit PD2<K> of the second section signal which is activated to a logic "high" level when the $K^{th}$ internal operation included in the second mode operation is terminated to generate the mode end signal M_END activated to a logic "high" level. In the present embodiment, it is assumed that the second mode operation includes the first to $K^{th}$ internal operations, but this is only an embodiment and the present disclosure is not limited thereto. In an embodiment, K may be an integer greater than one.

The operations of the device 100 configured as described above will be described with reference to FIGS. 13 to 20 as follows.

Figure 13:
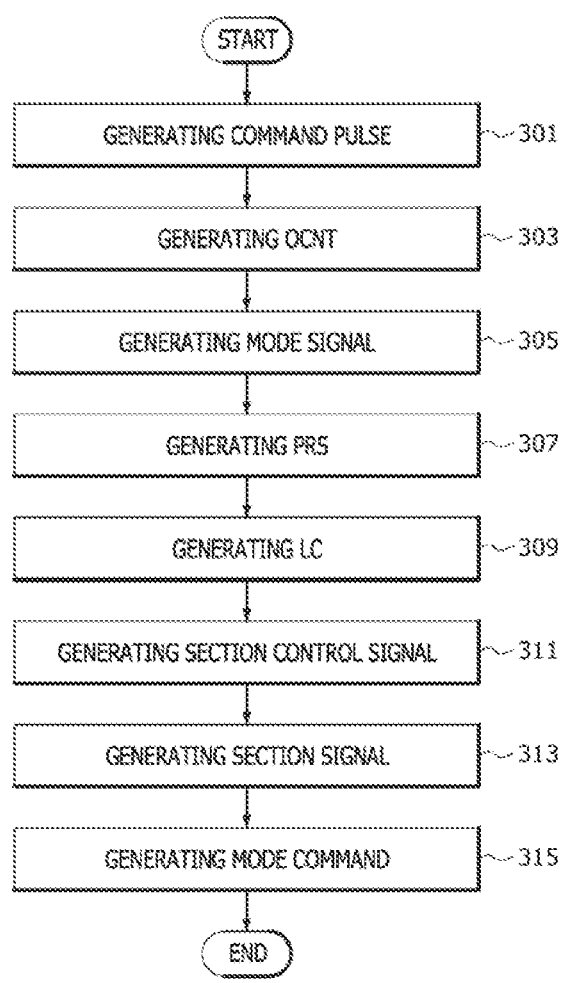
Figure 14:
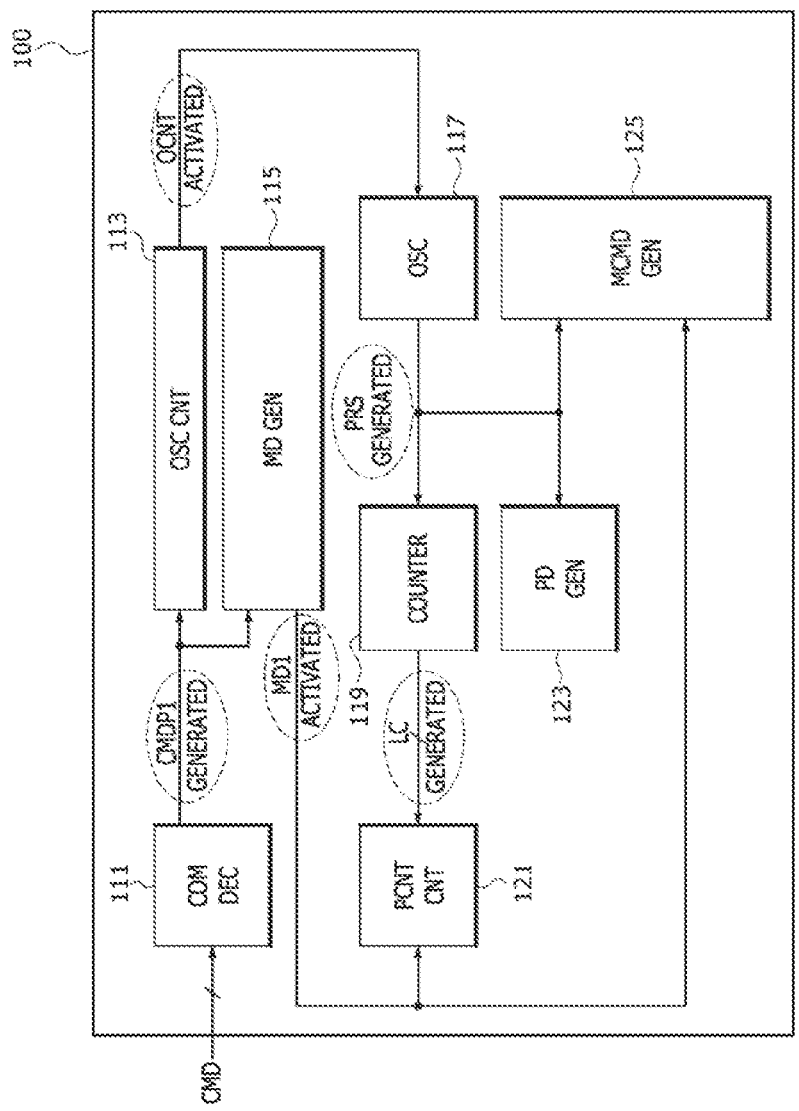
Figure 15:
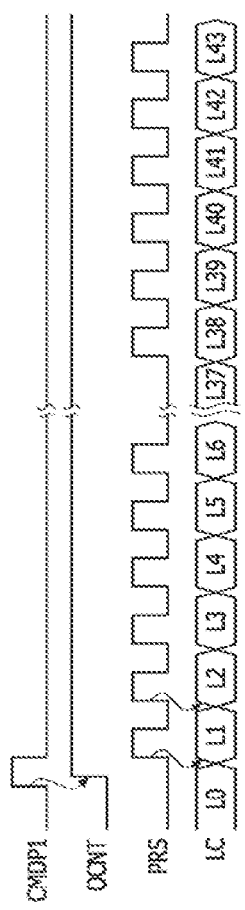

First, as illustrated in FIGS. 13 to 15, a command decoder 111 decodes a command CMD to generate a first command pulse CMDP1 which is activated to perform a first mode operation (301). The command decoder 111 applies the first command pulse CMDP1 to an oscillating control circuit 113 and a mode signal generation circuit 115.

Next, as illustrated in FIGS. 13 to 15, the oscillating control circuit 113 receives the activated first command pulse CMDP1 to generate an activated oscillating control signal OCNT (303). The oscillating control circuit 113 applies the oscillating control signal OCNT to an oscillator 117.

Next, as illustrated in FIGS. 13 to 15, the mode signal generation circuit 115 receives the activated first command pulse CMDP1 to generate an activated first mode signal MD1 (305). The mode signal generation circuit 115 applies the first mode signal MD1 to a section control signal generation circuit 121 and a mode command generation circuit 125.

Next, as illustrated in FIGS. 13 to 15, the oscillator 117 receives the activated oscillating control signal OCNT to generate an activated oscillating signal PRS that is toggled with a preset section (307). The preset section may be variously set according to embodiments. The oscillator 117 applies the oscillating signal PRS to a counter 119, a section signal generation circuit 123, and the mode command generation circuit 125.

Next, as illustrated in FIGS. 13 to 15, the counter 119 may count each time the oscillating signal PRS is toggled to generate a latch code LC (309). A bit of the latch code LC is initialized to the initial bit set L0, and each time the oscillating signal PRS is toggled, the bit set of the latch code LC is sequentially changed from the first bit set L1 to a 43$^{rd}$ bit set L43.

As illustrated in FIG. 16, the bit set of the latch code LC is set to the first bit set L1 when the oscillating signal PRS is toggled once. The first bit set L1 means that the first to sixth bits LC<6:1> of the latch code are set to '000001'. As illustrated in FIG. 16, the bit set of the latch code LC is set to a second bit set L2 when the oscillating signal PRS is toggled twice. The second bit set L2 means that the first to sixth bits LC<6:1> of the latch code are set to '000010'. As illustrated in FIG. 16, the bit set of the latch code LC is set as a sixth bit set L6 when the oscillating signal PRS is toggled six times. The sixth bit set L6 means that the first to sixth bits LC<6:1> of the latch code are set to '000110'. As illustrated in FIG. 16, the bit set of the latch code LC is set to a 38$^{th}$ bit set L38 when the oscillating signal PRS is toggled 38 times. The 38$^{th}$ bit set L38 means that the first to sixth bits LC<6:1> of the latch code are set to '100110'. As illustrated in FIG. 16, the bit set of the latch code LC is set to a 43$^{rd}$ bit set L43 when the oscillating signal PRS is toggled 43 times. The 43$^{rd}$ bit set L43 means that the first to sixth bits LC<6:1> of the latch code are set to '101011'.

Figure 17:
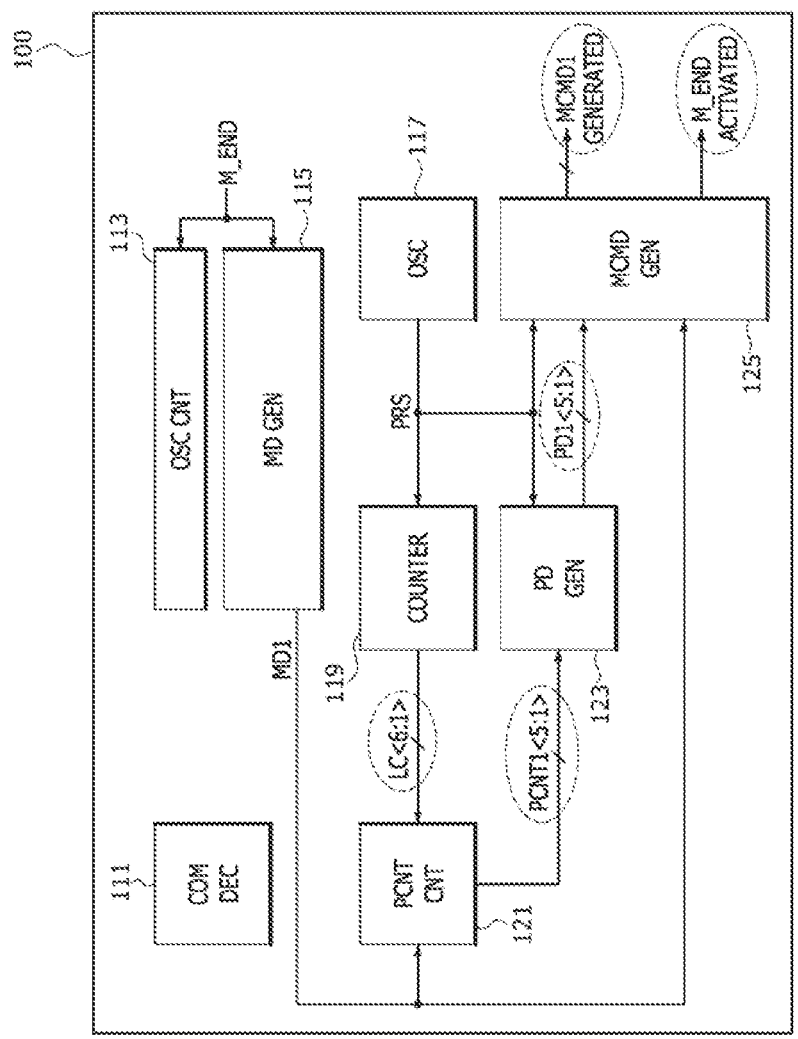
Figure 18:
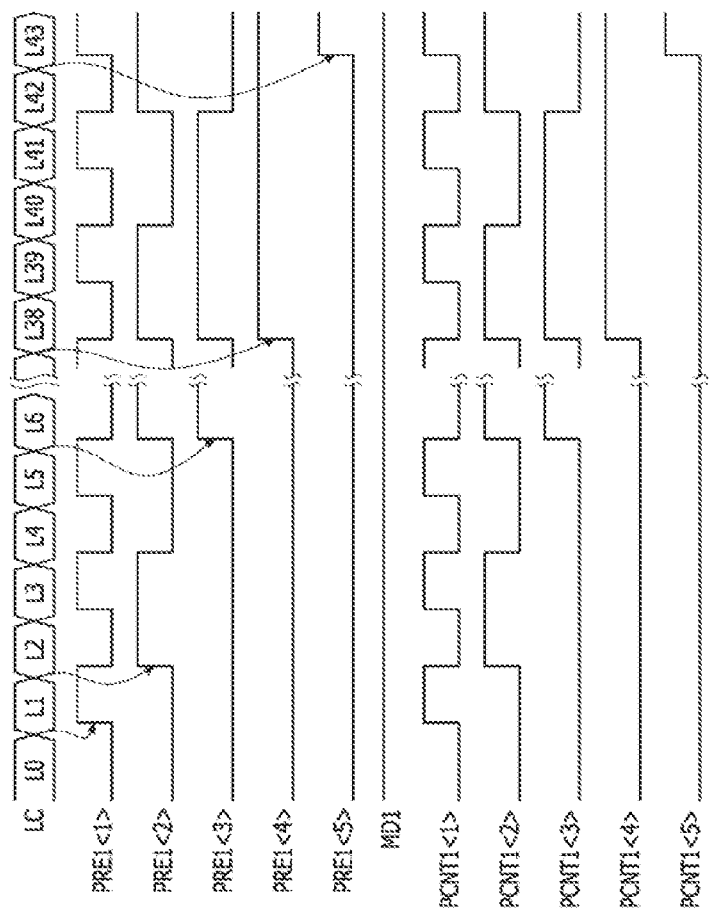

Next, as illustrated in FIGS. 13, 17, and 18, the section control signal generation circuit 121 generates first to fifth bits PRE1<5:1> of a first pre-signal, based on the first to sixth bits LC<6:1> of the latch code when the first mode signal MD1 which is activated to a logic "high" level by performing the first mode operation is received. The bit set of the first to fifth bits PRE1<5:1> of the first pre-signal may be set according to the bit set of the first to sixth bits LC<6:1> of the latch code. The first bit PREI<1> of the first pre-signal is activated for the first time when the bit set of the latch code LC is set to the first bit set L1, and the second bit PREI<2> of the first pre-signal is activated for the first time when the bit set of the latch code LC is set to the second bit set L2. In addition, the third bit PREI<3> of the first pre-signal is activated for the first time when the bit set of the latch code LC is set to the sixth bit set L6, the fourth bit PREI<4> of the first pre-signal is activated for the first time when the bit set of the latch code LC is set to the 38$^{th}$ bit set (L38), and the fifth bit PREI<5> of the first pre-signal is activated for the first time when the bit set of the latch code LC is set to the 43$^{rd}$ bit set L43. The section control signal generation circuit 121 buffers the first to fifth bits PRE1<5:1> of the first pre-signal to generate the first to fifth bits PCNT1<5:1> of the first section control signal (311).

Figure 19:
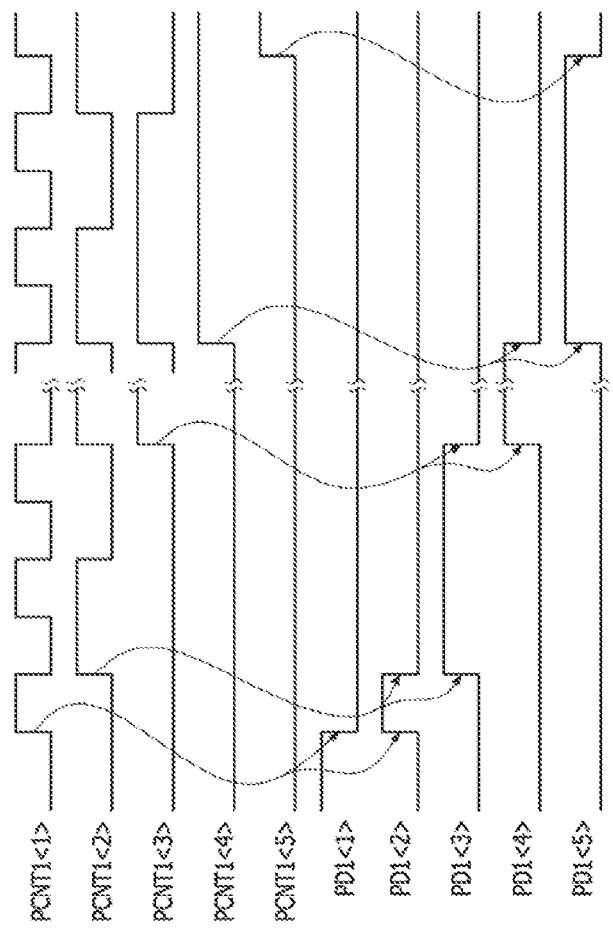

Next, as illustrated in FIGS. 13, 17, and 19, the section signal generation circuit 123 generates the first to fifth bits PD1<5:1> of the first section signal from the first to fifth bits PCNT1<5:1> of the first section control signal (313). The section signal generation circuit 123 generates a first bit PD1<1> of the first section signal which is deactivated to a logic "low" level to terminate a first internal operation included in a first mode operation and generates a second bit PD1<2> of the first section signal which is activated to a logic "high" level to perform a second internal operation included in the first mode operation, when the first bit PCNT1<1> of the first section control signal is activated to a logic "high" level for the first time in synchronization with the oscillating signal PRS. The section signal generation circuit 123 generates the second bit PD1<2> of the first section signal which is deactivated to a logic "low" level to terminate the second internal operation included in the first mode operation and generates a third bit PD1<3> of the first section signal which is activated to a logic "high" level to perform a third internal operation included in the first mode operation, when the second bit PCNT1<2> of the first section control signal is activated to a logic "high" level for the first time in synchronization with the oscillating signal PRS. The section signal generation circuit 123 generates the third bit PD1<3> of the first section signal which is deactivated to a logic "low" level to terminate the third internal operation included in the first mode operation and generates a fourth bit PD1<4> of the first section signal that is activated to a logic "high" level to perform a fourth internal operation included in the first mode operation, when the third bit PCNT1<3> of the first section control signal is activated to a logic "high" level for the first time in synchronization with the oscillating signal PRS. The section signal generation circuit 123 generates the fourth bit PD1<4> of the first section signal which is deactivated to a logic "low" level to terminate the fourth internal operation included in the first mode operation and generates a fifth bit PD1<5> of the first section signal activated to a logic "high" level to perform a fifth internal operation included in the first mode operation, when the fourth bit PCNT1<4> of the first section control signal is activated to a logic "high" level for the first time in synchronization with the oscillating signal PRS. The section signal generation circuit 123 generates the fifth bit PD1<5> of the first section signal which is deactivated to a logic "low" level to terminate the fifth internal operation included in the first mode operation, when the fifth bit PCNT1<5> of the first section control signal is activated to a logic "high" level for the first time in synchronization with the oscillating signal PRS.

Figure 20:
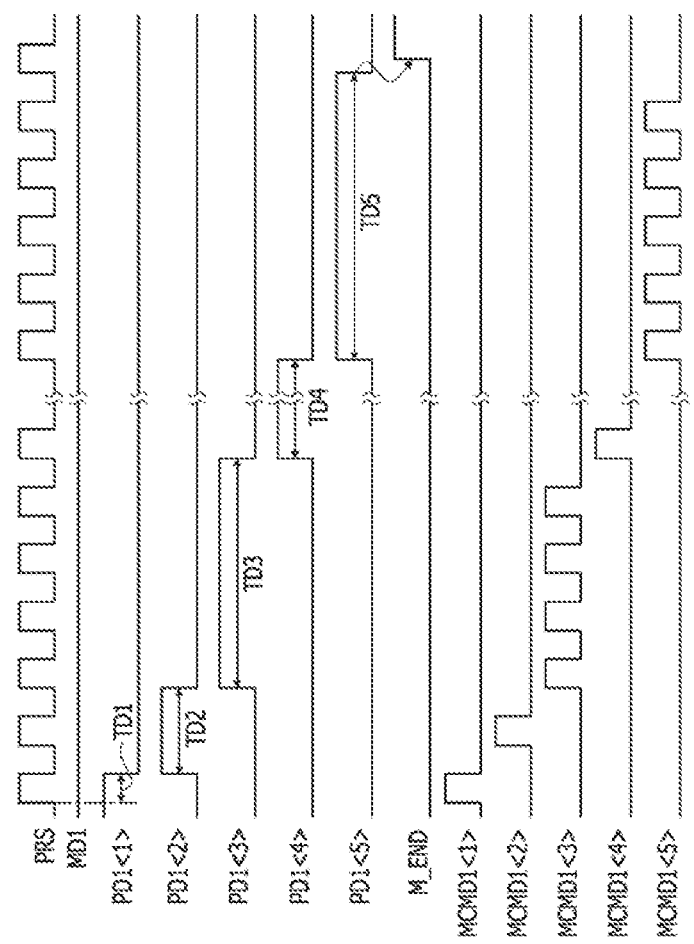

Finally, as illustrated in FIGS. 13, 17, and 20, the mode command generation circuit 125 generates first to fifth bits MCMD1<5:1> of the first mode command, based on the first to fifth bits PD1<5:1> of the first section signal and the oscillating signal PRS while the first mode signal MD1 is activated to a logic "high" level (315). The mode command generation circuit 125 generates a first bit MCMD1<1> of the first mode command for performing a first internal operation included in the first mode operation during a first operation section TD1 set from a time when the oscillating signal PRS is generated to a time when the first bit PD1<1> of the first section signal is activated to a logic "high" level. The mode command generation circuit 125 generates a second bit MCMD1<2> of the first mode command for performing a second internal operation included in the first mode operation during a second operation section TD2 in which the second bit PD1<2> of the first section signal is activated to a logic "high" level. The mode command generation circuit 125 generates a third bit MCMD1<3> of the first mode command for performing a third internal operation included in the first mode operation during a third operation section TD3 in which the third bit PD1<3> of the first section signal is activated to a logic "high" level. The mode command generation circuit 125 generates a fourth bit MCMD1<4> of the first mode command for performing a fourth internal operation included in the first mode operation during a fourth operation section TD4 in which the fourth bit PD1<4> of the first section signal is activated to a logic "high" level. The mode command generation circuit 125 generates a fifth bit MCMD1<5> of the first mode command for performing a fifth internal operation included in the first mode operation during a fifth operation section TD5 in which the fifth bit PD1<5> of the first section signal is activated to a logic "high" level.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

What is claimed is:

1. A device comprising:
   a section signal generation circuit configured to generate a first section signal including bits activated during an operation section of each of internal operations included in a first mode operation, and generate a second section signal including bits activated during an operation section of each of internal operations included in a second mode operation;
   a mode command generation circuit configured to generate a first mode command for performing the internal operations included in the first mode operation from an oscillating signal, based on the first section signal, and generate a second mode command for performing the internal operations included in the second mode operation from the oscillating signal, based on the second section signal; and
   a section control signal generation circuit configured to receive a latch code generated by counting based on the oscillating signal, and generate a first section control signal and a second section control signal, based on a first mode signal and a second mode signal,
   wherein the section signal generation circuit receives the first section control signal generated from the latch code in the first mode operation, and receives the second section control signal generated from the latch code in the second mode operation.

2. The device of claim 1, wherein the section signal generation circuit includes:
   a first section signal generator configured to generate the first section signal, based on the first section control signal; and
   a second section signal generator configured to generate the second section signal, based on the second section control signal.

3. The device of claim 2, wherein the first mode operation includes a first internal operation and a second internal operation, and
   wherein the first section signal generator includes:
   a first section control circuit configured to generate a first bit of the first section signal which is deactivated to terminate the first internal operation when a first bit of the first section control signal is activated for the first time in synchronization with the oscillating signal; and
   a second section control circuit configured to generate a second bit of the first section signal which is activated to perform the second internal operation when the first bit of the first section control signal is activated for the first time in synchronization with the oscillating signal.

4. The device of claim 3, wherein the second section control circuit generates a second bit of the first section signal which is deactivated to terminate the second internal operation when the second bit of the first section control signal is activated for the first time in synchronization with the oscillating signal.

5. The device of claim 1, wherein the section control signal generation circuit includes:
   a first pre-signal generator configured to generate a first pre-signal for controlling an operation section of each of the internal operations included in the first mode operation, based on the latch code;
   a second pre-signal generator configured to generate a second pre-signal for controlling an operation section of each of the internal operations included in the second mode operation, based on the latch code; and
   a section control signal selector configured to generate the first section control signal and the second section control signal from the first pre-signal and the second pre-signal, based on the first mode signal and the second mode signal.

6. The device of claim 5, wherein the section control signal selector outputs the first pre-signal as the first section control signal when the first mode signal is activated, and outputs the second pre-signal as the second section control signal when the second mode signal is activated.

7. The device of claim 1, wherein the mode command generation circuit includes a first mode command generator configured to output the oscillating signal as the first mode command during a section in which the first section signal is activated.

8. The device of claim 7, wherein the first mode operation includes a first internal operation and a second internal operation, and
   wherein the first mode command generator outputs the oscillating signal as a first bit of the first mode command during a section in which a first bit of the first section signal is activated to perform the first internal operation, and outputs the oscillating signal as a second bit of the first mode command during a section in which a second bit of the first section signal is activated to perform the second internal operation.

9. The device of claim 7, wherein the mode command generation circuit further includes a second mode command generator configured to output the oscillating signal as the second mode command during a section in which the second section signal is activated.

10. The device of claim 7, wherein the mode command generation circuit further includes a mode end signal generator configured to generate a mode end signal that is activated when one of all of the internal operations included in the first mode operation are terminated and all of the internal operations included in the second mode operation are terminated.

11. The device of claim 1, further comprising an oscillator configured to receive an oscillating control signal which is activated when one of the first mode operation is performed and the second mode operation is performed to generate the oscillating signal.

12. The device of claim 1, further comprising a mode signal generation circuit configured to generate the first mode signal which is activated when the first mode operation is performed, and generate the second mode signal which is activated when the second mode operation is performed.

13. A device comprising:
a section signal generation circuit configured to generate a section signal including bits activated during an operation section of each of internal operations included in a mode operation;
a mode command generation circuit configured to generate a mode command for performing the internal operations included in the mode operation from an oscillating signal, based on the section signal; and
a section control signal generation circuit configured to receive a latch code generated by counting based on the oscillating signal, and generate a section control signal, based on a mode signal,
wherein the section signal generation circuit receives the section control signal generated from the latch code in the mode operation.

14. The device of claim 13, wherein the mode operation includes a first internal operation and a second internal operation, and
wherein the section signal generation circuit includes:
a first section control circuit configured to generate a first bit of the section signal which is deactivated to terminate the first internal operation when a first bit of the section control signal is activated for the first time in synchronization with the oscillating signal; and
a second section control circuit configured to generate a second bit of the section signal which is activated to perform the second internal operation when the first bit of the section control signal is activated for the first time in synchronization with the oscillating signal.

15. The device of claim 14, wherein the second section control circuit generates the second bit of the section signal which is deactivated to terminate the second internal operation when the second bit of the section control signal is activated for the first time in synchronization with the oscillating signal.

16. The device of claim 13, wherein the mode command generation circuit outputs the oscillating signal as the mode command during a section in which the section signal is activated.

17. The device of claim 16, wherein the mode operation includes a first internal operation and a second internal operation, and
wherein the mode command generation circuit outputs the oscillating signal as a first bit of the mode command during a section in which a first bit of the section signal is activated to perform the first internal operation, and outputs the oscillating signal as a second bit of the mode command during a section in which a second bit of the section signal is activated to perform the second internal operation.

* * * * *